United States Patent
Lee et al.

(10) Patent No.: US 7,215,587 B2
(45) Date of Patent: May 8, 2007

(54) TRACKING CIRCUIT FOR A MEMORY DEVICE

(75) Inventors: Cheng Hung Lee, Hsinchu (TW); Simon Wang, Hsinchu (TW); Hung-Jen Liao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 155 days.

(21) Appl. No.: 11/172,873

(22) Filed: Jul. 5, 2005

(65) Prior Publication Data

US 2007/0008771 A1   Jan. 11, 2007

(51) Int. Cl.
*G11C 7/00* (2006.01)

(52) U.S. Cl. .................. 365/200; 365/190; 365/194

(58) Field of Classification Search ................ 365/203, 365/200, 190–193, 194–195, 154, 49
See application file for complete search history.

(56) References Cited

U.S. PATENT DOCUMENTS

| | | | |
|---|---|---|---|
| 5,020,031 A | 5/1991 | Miyatake | |
| 5,027,320 A | 6/1991 | Pathak et al. | |
| 5,172,338 A | 12/1992 | Mehrotra et al. | |
| 5,586,077 A | 12/1996 | Olivo et al. | |
| 5,627,779 A | 5/1997 | Odake et al. | |
| 5,633,832 A | 5/1997 | Patel et al. | |
| 5,657,277 A | 8/1997 | Shirley | |
| 5,694,356 A | 12/1997 | Wong et al. | |
| 5,694,367 A | 12/1997 | Toyoshima et al. | |
| 5,805,507 A | 9/1998 | Hull et al. | |
| 5,867,449 A | 2/1999 | Casper | |
| 5,936,905 A | 8/1999 | Proebsting | |
| 6,208,575 B1 * | 3/2001 | Proebsting | 365/208 |
| 6,240,030 B1 | 5/2001 | Kang et al. | |
| 6,373,753 B1 * | 4/2002 | Proebsting | 365/189.09 |

OTHER PUBLICATIONS

Lee et al., "Control Logic and Cell Design for a 4K NVRAM", IEEE Journal of Solid-State Circuits, vol. SC-18, No. 5, Oct. 1983, pp. 525-532.
Childs et al., "An 18 ns 4K X 4 CMOS SRAM", IEEE Journal of Solid-State Circuits, vol. SC-19, No. 5, Oct. 1984, pp. 545-551.
Chappell et al., "Stability and SER Analysis of Static RAM Cells", IEEE Journal of Solid-State Circuits, vol. SC-20, No. 1, Feb. 1985, pp. 383-390.

(Continued)

*Primary Examiner*—Son Dinh
*Assistant Examiner*—Hien N Nguyen
(74) *Attorney, Agent, or Firm*—Finnegan, Henderson, Farabow, Garrett & Dunner, L.L.P.

(57) ABSTRACT

A memory device includes a memory array, an I/O circuit for accessing the memory array, and a tracking circuit. The tracking circuit includes a dummy bit line, a first tracking cell including a first NMOS transistor, the first tracking cell being coupled to receive a control signal and also coupled to the dummy bit line through the first NMOS transistor, and a second tracking cell including a second NMOS transistor, the second tracking cell being coupled to receive the control signal and also coupled to the dummy bit line through the second NMOS transistor, a gate of the second NMOS transistor being coupled to the dummy bit line. The memory device also includes a control circuit coupled to the dummy bit line for generating a clock signal for the I/O circuit.

24 Claims, 7 Drawing Sheets

OTHER PUBLICATIONS

Wong et al., "Novel Circuit Techniques for Zero-Power 25-ns CMOS Erasable Programmable Logic Devices (EPLS's)", IEEE Journal of Solid-State Circuits, vol. SC-21, No. 5, Oct. 1986, pp. 766-744.

Amrutur et al., "A Replica Technique for Wordline and Sense Control in Low-Power SRAM's", IEEE Journal of Solid-State Circuits, vol. 33, No. 8, Aug. 1998, pp. 1208-1219.

Modelli et al., "Basic Feasibility Constraints for Multilevel CHE-Programmed Flash Memories", IEEE Transactions on Electron Devices, vol. 48, No. 9, Sep. 2001, pp. 2032-2042.

Chang et al., "Supply and Substrate Noise Tolerance Using Dynamic Tracking Clusters in Configurable Memory Designs", Proceedings of the 5th International Symposium on Quality Electronic Design, 2004, pp. 297-302.

* cited by examiner

TRACKING CIRCUIT FOR A MEMORY DEVICE

TECHNICAL FIELD

This invention relates generally to a tracking circuit in a memory device and, more particularly, to a tracking circuit for tracking minimum power supply voltage.

BACKGROUND

Memory devices are digital circuits and operate on clock signals in order for different parts thereof to act on a synchronized schedule. However, a clock signal received by a memory device may reach different parts thereof through different paths and at different times. Such mismatch between different signal paths results in problems, one of which being a reduced read margin of the memory device. FIGS. 1, 2, 3A, and 3B illustrate the problem of reduced read margin due to the different clock signal delays and a conventional technique for overcoming the problem.

Figure 1:
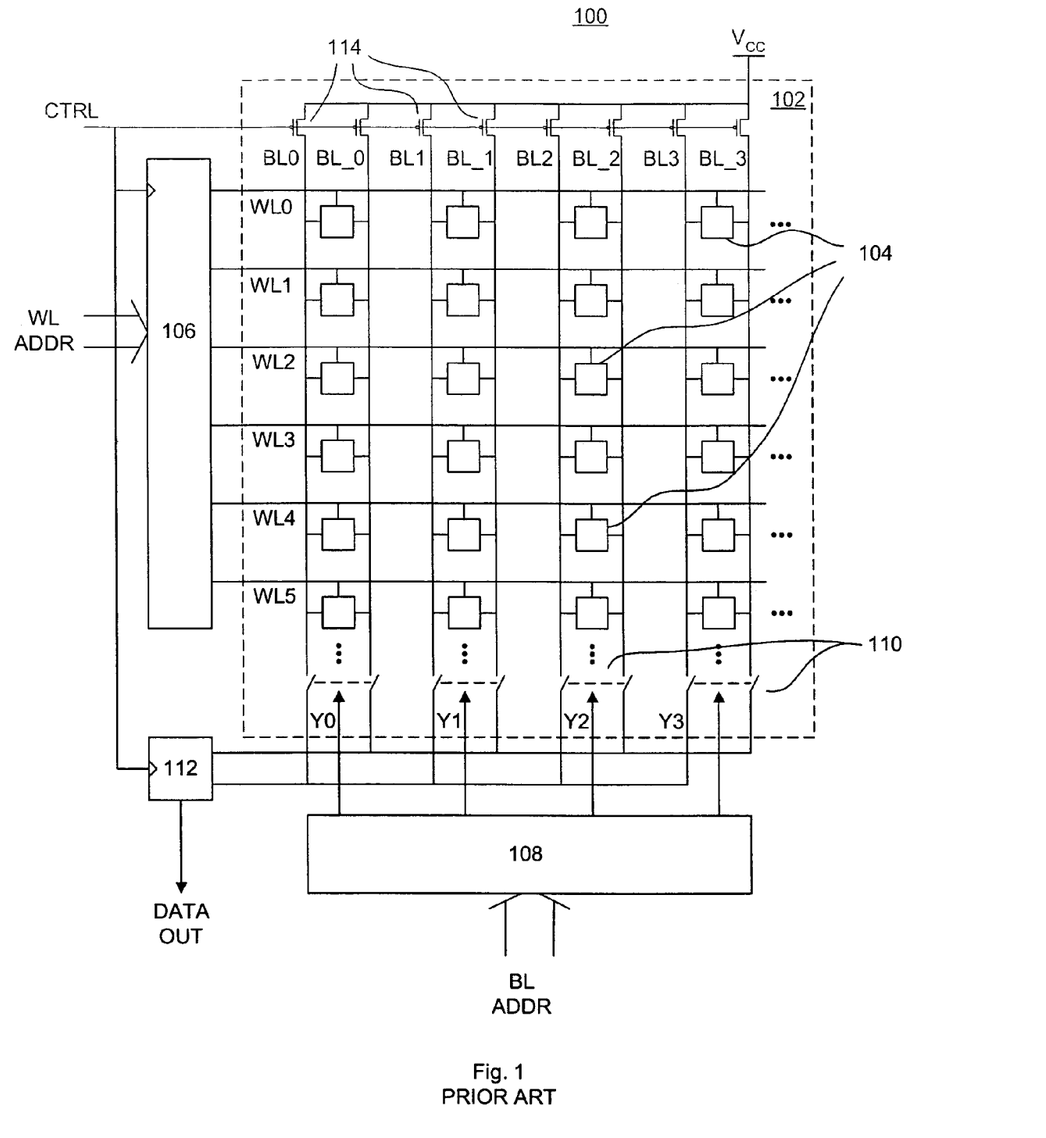
FIG. 1 shows a conventional memory device.

FIG. 1 shows a portion of a memory device 100. Memory device 100 includes one or more memory arrays 102 (only one of which is shown). Each memory array 102 includes a plurality of memory cells 104 arranged in a plurality of rows and a plurality of columns, each row corresponding to a word line WL (WL0, WL1, ... ) and each column corresponding to a pair of bit lines, BL and BL_ ((BL0, BL_0), (BL1, BL_1), (BL2, BL_2) ... ). A word line decoder 106 receives word line address signals ("WL ADDR") and provides word line signals to select one of word lines WL of memory array 102. A bit line decoder 108 receives bit line address signals ("BL ADDR") and provides bit line signals Y (Y0, Y1, Y2, ... ) to select a pair of bit lines BL and BL_of memory array 102 through switches 110. Each switch 110 may comprise a pair of NMOS transistors, and is turned on and off by bit line signals Y. Each memory cell 104 may be selected by selecting the corresponding word line and pair of bit lines. An I/O circuit 112 is coupled to bit lines BL and BL_to detect the datum stored in the selected memory cell 104 and to output the same. A control signal CTRL is provided to word line decoder 106 and I/O circuit 112 as a clock signal to trigger the operations thereof. For example, on an edge (rising edge or falling edge) of control signal CTRL, word line decoder 106 may decode the word line address and I/O circuit 112 may detect a datum stored in a selected memory cell 104 and output the same. Memory device 100 also includes a plurality of precharging PMOS transistors 114 each coupling a corresponding bit line BL or BL_ to a power supply voltage $V_{cc}$ to precharge the corresponding bit line BL or BL_, thereby increasing a speed of accessing memory cells 104.

Figure 2:
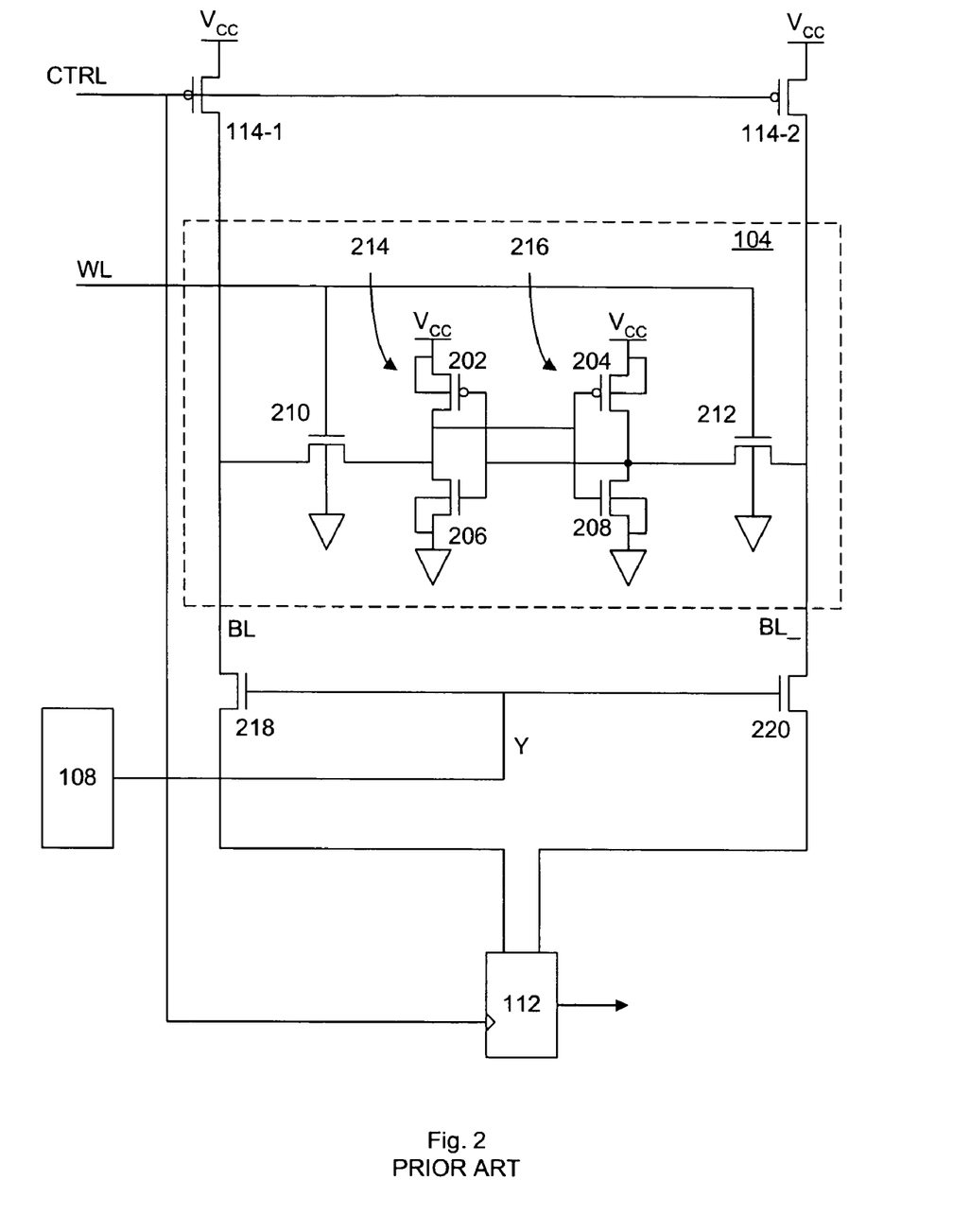
FIG. 2 shows a memory cell of the memory device of FIG. 1.

Memory cells 104 may comprise any suitable structure, such as a conventional 6-transistor structure shown in FIG. 2. FIG. 2 shows one memory cell 104 including two PMOS transistors 202 and 204 and four NMOS transistors 206, 208, 210, and 212. Each of MOS transistors 202, 204, 206, 208, 210, and 212 has a gate, a source, a drain, and a substrate. The gate of PMOS transistor 202, the gate of NMOS transistor 206, the drain of PMOS transistor 204, the drain of NMOS transistor 208, and the source of NMOS transistor 212 are all coupled to one another. The gate of PMOS transistor 204, the gate of NMOS transistor 208, the drain of PMOS transistor 202, the drain of NMOS transistor 206, and the source of NMOS transistor 210 are all coupled to one another. The sources and substrates of PMOS transistors 202 and 204 are coupled to power supply voltage $V_{cc}$. The sources and substrates of NMOS transistors 206 and 208 and the substrates of NMOS transistors 210 and 212 are grounded. The gates of NMOS transistors 210 and 212 are coupled to receive the word line signal WL. The drain of NMOS transistor 210 is coupled to bit line BL. The drain of NMOS transistor 212 is coupled to bit line BL_. Thus, PMOS transistor 202 and NMOS transistor 206 form an inverter 214, and PMOS transistor 204 and NMOS transistor 208 form an inverter 216. Inverters 214 and 216 are coupled to form a loop and may stably store a bit of datum. If the drains of PMOS transistor 202 and NMOS transistor 206 are at a logic high, i.e., approximately $V_{cc}$, then the drains of PMOS transistor 204 and NMOS transistor 208 are at a logic low, i.e., approximately ground, and memory cell 104 may be considered to have stored therein a logic high datum. If the drains of PMOS transistor 202 and NMOS transistor 206 are at logic low, then the drains of PMOS transistor 204 and NMOS transistor 208 are at logic high, and memory cell 104 is considered to have stored therein a logic low datum. When NMOS transistors 210 and 212 are turned on by word line signal WL, the datum stored in memory cell 104 and its reverse respectively appear on corresponding bit lines BL and BL_.

FIG. 2 also shows two of precharging PMOS transistors 114, 114-1 and 114-2, each having a gate, a drain, and a source. The gates of precharging PMOS transistors 114-1 and 114-2 are coupled to receive control signal CTRL. The sources of precharging PMOS transistors 114-1 and 114-2 are coupled to power supply voltage $V_{cc}$. The drain of precharging PMOS transistor 114-1 is coupled to bit line BL. The drain of precharging PMOS transistor 114-2 is coupled to bit line BL_. Switch 110 is shown to include NMOS transistors 218 and 220, each having a gate, a drain, and a source. The gates of NMOS transistors 218 and 220 are coupled to bit line decoder 108 to receive bit line signal Y. The drain of NMOS transistor 218 is coupled to bit line BL. The drain of NMOS transistor 220 is coupled to bit line BL_. I/O circuit 112 is coupled to the sources of NMOS transistors 218 and 220. Thus, when one memory cell 104 is selected, corresponding NMOS transistors 218 and 220 are turned on, corresponding NMOS transistors 210 and 212 are also turned on, corresponding PMOS transistors 114-1 and 114-2 are turned off, and I/O circuit 112 is allowed to access the datum stored in the selected memory cell 104 through corresponding bit lines BL and BL_. Then, on an edge of control signal CTRL, I/O circuit 112 is triggered to detect voltages on bit lines BL and BL_, amplifies a differential voltage across bit lines BL and BL_, and outputs the amplified differential voltage.

Due to parasitic resistances and capacitances, bit lines BL and BL_ corresponding to the selected memory cell 104 do not instantly exhibit the datum stored in the selected memory cell 104. Rather, if the datum stored in the selected memory cell 104 is a logic low, the corresponding bit line BL is gradually discharged from a precharged logic high state to a logic low state. Conversely, if the datum stored in the selected memory cell 104 is a logic high, the corresponding bit line BL_ is gradually discharged from a precharged logic high state to a logic low state. A read margin is defined as the differential voltage across the corresponding pair of bit lines BL and BL_ when I/O circuit 112 is triggered to detect the voltages on bit lines BL and BL_ Because I/O circuit 112 can only detect a differential voltage above a certain level, e.g., 100 mV, a small read margin, if below that certain level, may result in a read failure. To avoid a read failure, the triggering of I/O circuit 112 should be delayed to allow the differential voltage across bit lines BL and BL_ to develop and exceed the detectable level of I/O circuit 112, i.e., to ensure a read margin exceeding the detectable level of I/O circuit 112. A conventional technique for delaying the triggering of I/O circuit 112 is by using a tracking circuit, an example of which is shown in FIG. 3A.

Figure 3A:
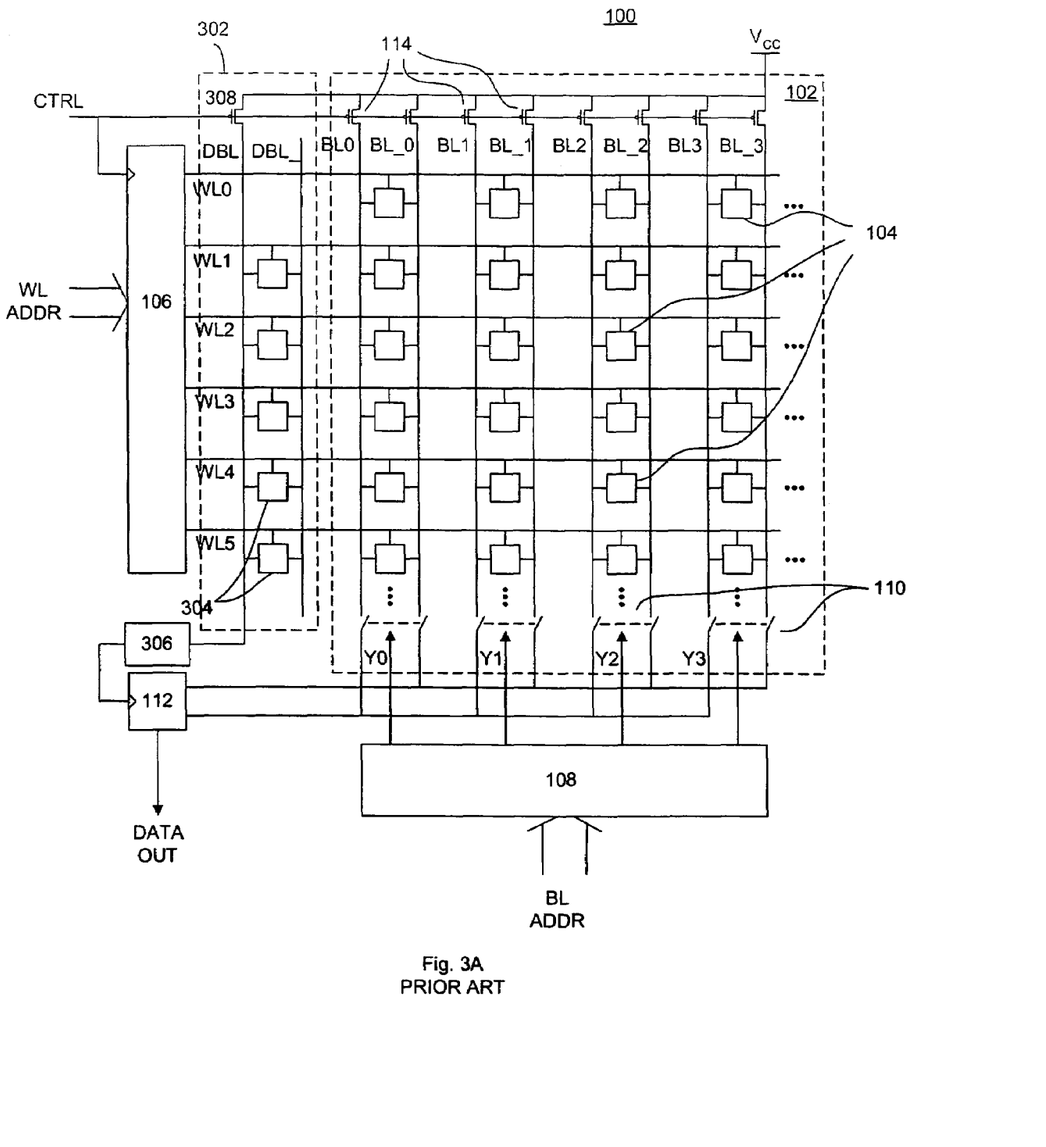
FIG. 3A shows a conventional memory device with a tracking circuit including tracking cells.

In FIG. 3A, a tracking circuit 302 is shown to include a pair of dummy bit lines DBL and DBL_ and several tracking cells 304. A conventional tracking circuit, such as tracking circuit 302, may include five or more tracking cells 304. Tracking circuit 302 receives and delays control signal CTRL. A control circuit 306 is coupled between tracking circuit 302 and I/O circuit 112 for receiving the delayed control signal CTRL and generating a clock signal for I/O circuit 112. An example of control circuit 306 is an inverter that simply inverts the delayed control signal CTRL. FIG. 3A shows that dummy bit line DBL is coupled to power supply voltage $V_{cc}$ through a precharging PMOS transistor 308.

Figure 3B:
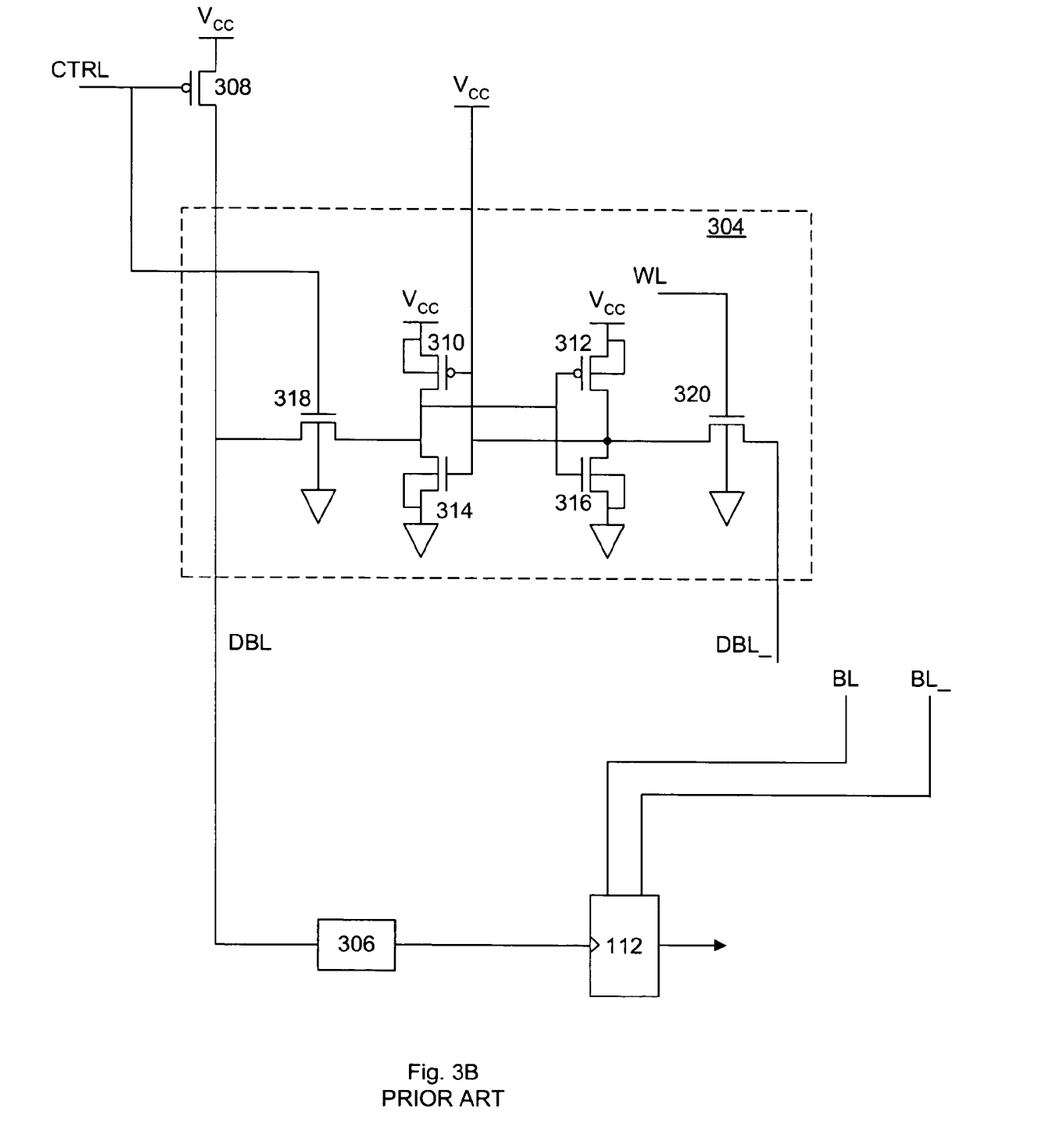
FIG. 3B shows the structure of the tracking cells of FIG. 3A.

FIG. 3B shows the detailed structure of one tracking cell 304, which includes 6 transistors, i.e., PMOS transistors 310 and 312 and NMOS transistors 314, 316, 318, and 320. As shown in FIGS. 2 and 3B, tracking cell 304 has a structure similar to memory cell 104, except that the gates of PMOS transistor 310 and NMOS transistor 314 are coupled to power supply voltage $V_{cc}$, and that the gate of NMOS transistor 318 is coupled to control signal CTRL. Also as shown in FIG. 3B, dummy bit line DBL_ is floating and not used, while dummy bit line DBL is coupled to I/O circuit 112 through control circuit 306 for generating the clock signal for I/O circuit 112.

When memory array 102 is not accessed, control signal CTRL is at logic 0, and dummy bit line DBL is pre-charged to a voltage level approximately equal to $V_{cc}$. When a memory cell 104 of memory array 102 is being accessed, control signal CTRL changes to logic high, turning off PMOS transistor 308 and turning on NMOS transistor 318. At the same time, word line signal WL is at logic high, and NMOS transistor 320 is turned on. Because NMOS transistor 314 is always turned on, precharged dummy bit line DBL is discharged through NMOS transistors 318 and 314. When the voltage on dummy bit line DBL drops below a flipping point, control circuit 306 generates a clock signal and I/O circuit 112 is triggered. Therefore, I/O circuit 112 is now triggered not by control signal CTRL, but rather is triggered by the clock signal generated by control circuit 306, which represents control signal CTRL delayed by the process of discharging dummy bit line DBL. Because tracking cell 304 has a structure similar to memory cell 104, the process of discharging dummy bit line DBL closely resembles the discharging process of bit lines BL or BL_ of memory cells 104. At the same time, control signal CTRL or a signal synchronized to control signal CTRL is used, without delay, to select and activate one of memory cells 104. Thus, through careful design of tracking cells 304, e.g., through control of the size of the six transistors of each tracking cell 304, the time period for discharging precharged dummy bit line DBL may be controlled to correspond to the time required to discharge the bit line BL or BL_ associated with the selected memory cell 104, such that a desirable read margin is achieved.

Memory devices are generally designed to operate at a certain power supply voltage, such as 1.2 V. But often the memory devices also need to operate at lower power supply voltages, such as 0.9 V or even lower. A problem with memory device 100 of FIG. 3A is that, when power supply voltage $V_{cc}$ is lowered, the read margin decreases accordingly, because the time period required to discharge precharged dummy bit line DBL is approximately proportional to how much charge is stored thereon, which is in turn approximately proportional to $V_{cc}$. For example, with the conventional tracking circuit shown in FIG. 3B, memory device 100 may have a read margin of above 100 mV when $V_{cc}$ is 1.2 V or above, but may have a read margin of less than 60 mV when $V_{cc}$ is 0.8 V. If I/O circuit 112 is capable of detecting only a differential voltage of 100 mV or above, a read margin of 60 mV will result in read failures. Thus, a minimum operable power supply voltage, VCCMIN, is largely limited by the tracking circuit. On the other hand, if $V_{cc}$ is high, the process of discharging dummy bit line DBL takes longer time, and the read margin of memory device 100 may be significantly higher than 100 mV, resulting in unnecessary power consumption.

SUMMARY OF THE INVENTION

Consistent with embodiments of the present invention, there is provided a memory device that includes a memory array, an I/O circuit for accessing the memory array, and a tracking circuit. The tracking circuit includes a dummy bit line, a first tracking cell including a first NMOS transistor, the first tracking cell being coupled to receive a control signal and also coupled to the dummy bit line through the first NMOS transistor, and a second tracking cell including a second NMOS transistor, the second tracking cell being coupled to receive the control signal and also coupled to the dummy bit line through the second NMOS transistor, a gate of the second NMOS transistor being coupled to the dummy bit line. The memory device also includes a control circuit coupled to the dummy bit line for generating a clock signal for the I/O circuit.

Consistent with embodiments of the present invention, there is also provided a memory device that includes a plurality of memory arrays, a plurality of I/O circuits, a plurality of control circuits, and a plurality of tracking circuits. Each tracking circuit includes a dummy bit line, a first tracking cell including a first NMOS transistor, the first tracking cell being coupled to receive a control signal and also coupled to the dummy bit line through the first NMOS transistor, and a second tracking cell including a second NMOS transistor, the second tracking cell being coupled to receive the control signal and also coupled to the dummy bit line through the second NMOS transistor, a gate of the second NMOS transistor being coupled to the dummy bit line. Each memory array corresponds to one of the plurality of I/O circuits, one of the plurality of tracking circuits, and one of the plurality of control circuits, and, for each memory array, the corresponding control circuit is coupled to the dummy bit line of the corresponding tracking circuit for generating a clock signal for the corresponding I/O circuit.

Consistent with embodiments of the present invention, there is further provided a tracking circuit in a memory device, wherein the memory device includes a memory array, an I/O circuit for accessing the memory array, and a control circuit, and wherein the tracking circuit is coupled to receive and delay a control signal for the control circuit to generate a clock signal for the I/O circuit. The tracking circuit includes a dummy bit line, one or more first tracking cells each including a first NMOS transistor, each of the first tracking cells being coupled to receive a control signal and also coupled to the dummy bit line through the first NMOS transistor, and one or more second tracking cells each including a second NMOS transistor, each of the second tracking cells being coupled to receive the control signal and also coupled to the dummy bit line through the second NMOS transistor, a gate of the second NMOS transistor being coupled to the dummy bit line.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

Consistent with a first embodiment of the present invention, there is provided a novel tracking circuit that tracks the effect of a lower power supply and provides a more stable read margin as compared to conventional tracking circuits.

Figure 4:
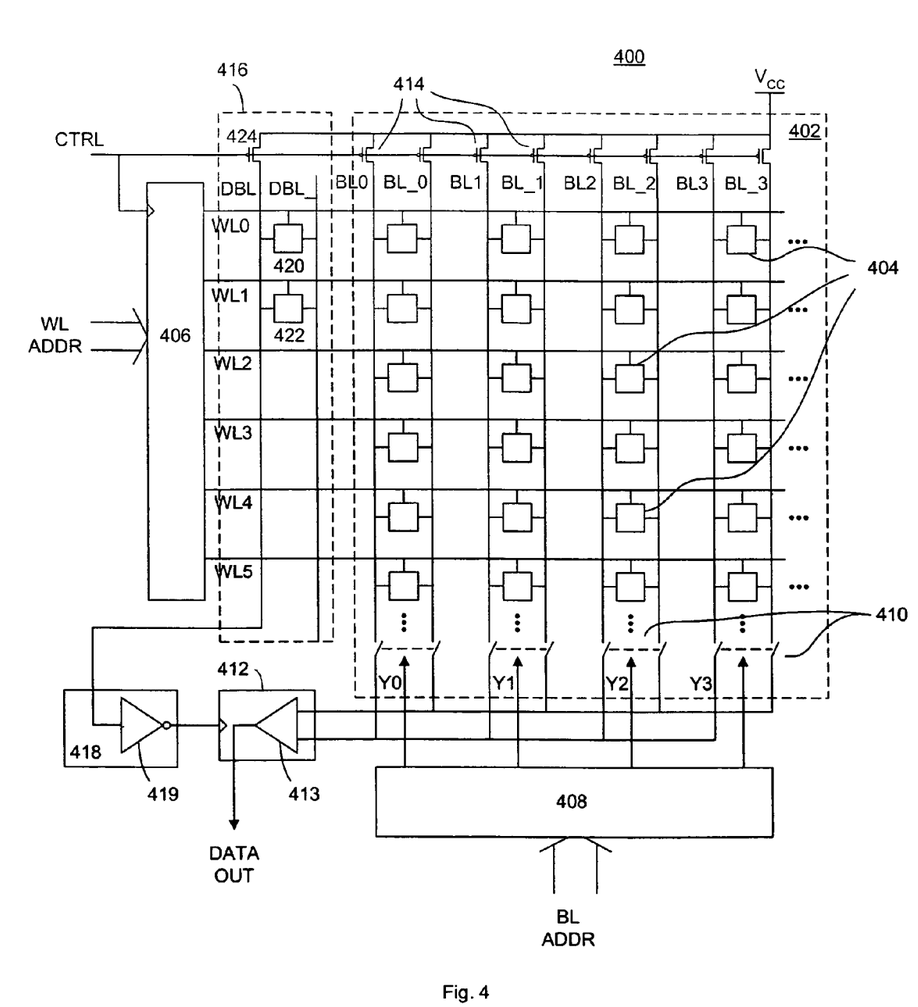
FIG. 4 shows a memory device including normal tracking cells and VCCMIN tracking cells consistent with a first embodiment of the present invention.

FIG. 4 shows a portion of a memory device 400 consistent with the first embodiment of the present invention. Memory device 400 includes one or more memory arrays 402 (only one of which is shown). Each memory array 402 includes a plurality of memory cells 404 arranged in a plurality of rows and a plurality of columns, each row corresponding to a word line WL (WL0, WL1, . . . ) and each column corresponding to a pair of bit lines, BL and BL_ ((BL0, BL_0), (BL1, BL_1), (BL2, BL_2) . . . ). Each memory cell 404 may comprise any suitable structure, such as the conventional 6-transistor structure as shown in FIG. 2. A word line decoder 406 receives word line address signals ("WL ADDR") and provides word line signals to select one of word lines WL of memory array 402. A bit line decoder 408 receives bit line address signals ("BL ADDR") and provides bit line signals Y (Y0, Y1, Y2, . . . ) to select a pair of bit lines BL and BL_ of memory array 402 through switches 410. Each switch 410 may comprise a pair of NMOS transistors, and is turned on and off by bit line signals Y. Each memory cell 404 may be selected by selecting the corresponding word line and the corresponding pair of bit lines. An I/O circuit 412 is coupled to bit lines BL and BL_ to detect the datum stored in the selected one of memory cells 404 and outputs the same. I/O circuit 412 may include one or more sense amplifiers 413 (only one of which is shown). Memory device 400 also includes a plurality of PMOS transistors 414 each coupling a bit line BL or BL_ to a power supply voltage $V_{cc}$ to precharge bit lines BL and BL_. A control signal CTRL is provided to word line decoder 406 and gates of PMOS transistors 414 to act as a clock signal therefor.

Consistent with the first embodiment of the present invention, memory device 400 also includes a tracking circuit 416 coupled to receive control signal CTRL. A control circuit 418 is coupled to tracking circuit 416 for generating a clock signal to drive I/O circuit 412. Control circuit 418 may comprise any combination of logic circuits and may vary depending on particularities of other parts of memory device 400. For example, control circuit 418 may include one or more inverters 419 (one of which is shown). Tracking circuit 416 includes a pair of dummy bit lines DBL and DBL_ and one or more normal tracking cells 420 (only one of which is shown) and one or more VCCMIN tracking cells 422 (only one of which is shown) coupled between the dummy bit lines DBL and DBL_. Dummy bit line DBL is coupled to I/O circuit 412 through control circuit 418, while dummy bit line DBL_ is floating and is not used. FIG. 4 also shows a PMOS transistor 424 coupling dummy bit line DBL to power supply voltage $V_{cc}$.

Figure 5:
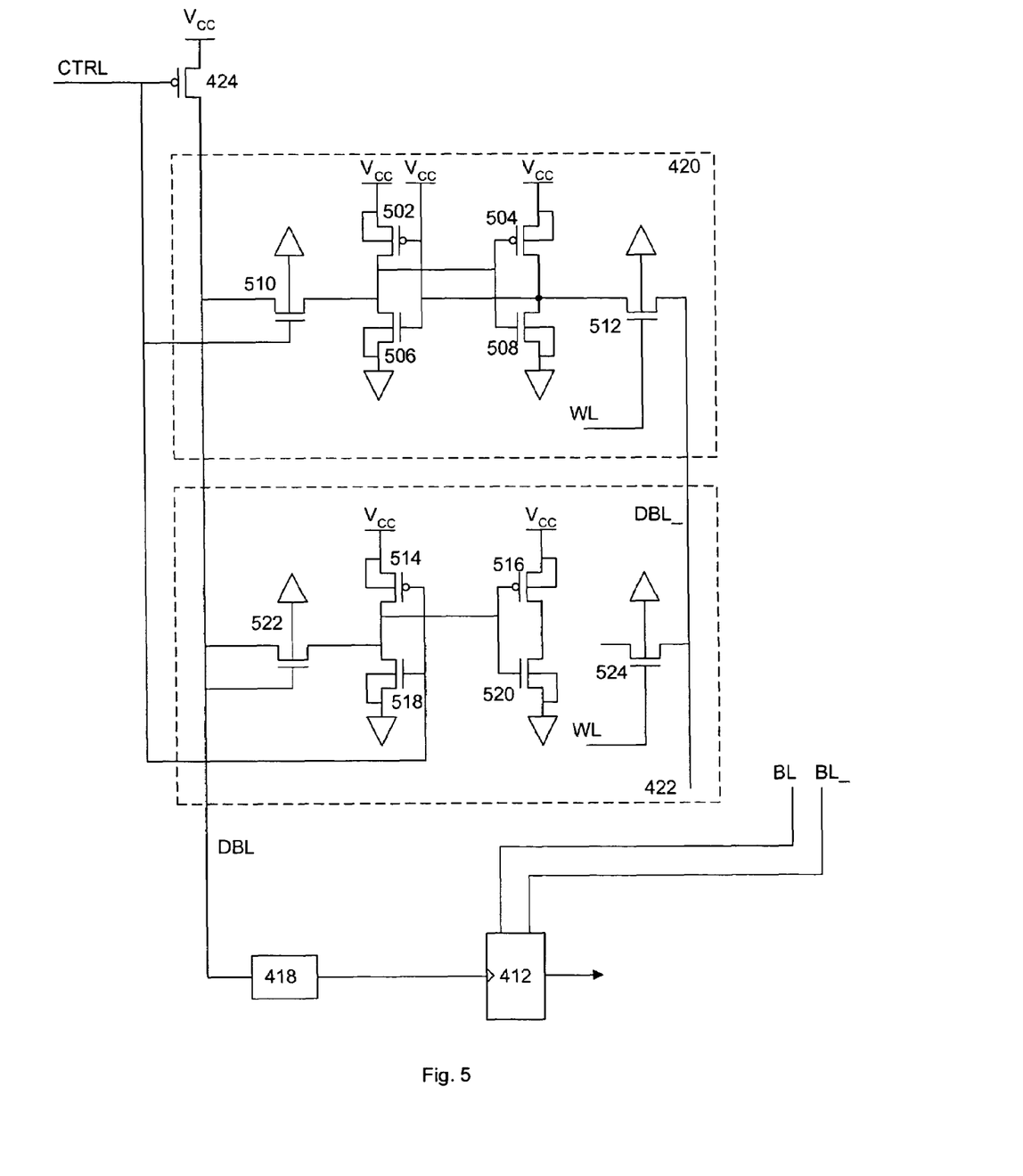
FIG. 5 shows structures of one normal tracking cell and one VCCMIN tracking cell consistent with the first embodiment of the present invention.

FIG. 5 shows the detailed structures of one normal tracking cell 420 and one VCCMIN tracking cell 422. Normal tracking cell 420 includes PMOS transistors 502 and 504 and NMOS transistors 506, 508, 510, and 512. Each of MOS transistors 502, 504, 506, 508, 510, and 512 has a gate, a source, a drain, and a substrate. The gate of PMOS transistor 502, the gate of NMOS transistor 506, the drain of PMOS transistor 504, the drain of NMOS transistor 508, and the source of NMOS transistor 512 are all coupled to one another and further coupled to power supply voltage $V_{cc}$. The gate of PMOS transistor 504, the gate of NMOS transistor 508, the drain of PMOS transistor 502, the drain of NMOS transistor 506, and the source of NMOS transistor 510 are all coupled to one another. The sources and substrates of PMOS transistors 502 and 504 are all coupled to power supply voltage $V_{cc}$. The sources and substrates of NMOS transistors 506 and 508 and the substrates of NMOS transistors 510 and 512 are all grounded. The drain of NMOS transistor 510 is coupled to dummy bit line DBL. The drain of NMOS transistor 512 is coupled to dummy bit line DBL_. The gate of NMOS transistor 510 is coupled to receive control signal CTRL. The gate of NMOS transistor 512 is coupled to one of word lines WL.

VCCMIN tracking cell 422 includes PMOS transistors 514 and 516 and NMOS transistors 518, 520, 522, and 524. Each of MOS transistors 514, 516, 518, 520, 522, and 524 has a gate, a source, a drain, and a substrate. The gates of PMOS transistor 514 and NMOS transistor 518 are both coupled to receive control signal CTRL. The gates of PMOS transistor 516 and NMOS transistor 520, the drains of PMOS transistor 514 and NMOS transistor 518, and the source of NMOS transistor 522 are coupled to one another. The drains of PMOS transistor 516 and NMOS transistor 520 are coupled to each other. The sources and substrates of PMOS transistors 514 and 516 are all coupled to power supply voltage $V_{cc}$. The sources and substrates of NMOS transistors 518 and 520 and the substrates of NMOS transistors 522 and 524 are all grounded. The drain and gate of NMOS transistor 522 are both coupled to dummy bit line DBL. The drain of NMOS transistor 524 is coupled to dummy bit line DBL_. The gate of NMOS transistor 524 is coupled to one of word lines WL. The source of NMOS transistor 524 is floating.

The operation of tracking circuit 416 is now described with reference to FIGS. 4 and 5.

When memory array 402 is not accessed, both control signal CTRL and word lines WL are at logic low. Therefore, PMOS transistor 424 is turned on to precharge dummy bit line DBL to a voltage level of approximately $V_{cc}$. NMOS transistors 510, 512, 518, 522, and 524 are turned off, and normal tracking cells 420 and VCCMIN tracking cells 422 are not operating.

When one of memory cells 404 is being accessed, clock signals substantially synchronized to control signal CTRL are provided to word line decoder 406 and bit line decoder 408 for selecting the corresponding word line WL and pair of bit lines BL and BL_. At the same time, control signal CTRL changes to a logic high, turning on NMOS transistors 510 and 518 and turning off PMOS transistor 424, starting a discharging process of precharged dummy bit line DBL. As the voltage on dummy bit line DBL drops below a flipping point, control circuit 418 generates a clock signal for triggering I/O circuit 412 to access the selected one of memory cells 404. Thus, by delaying control signal CTRL through the process of discharging precharged dummy bit line DBL, I/O circuit 412 is triggered some time after one memory cell 404 is selected, and a satisfactory read margin may be achieved.

Dummy bit line DBL may be discharged through normal tracking cells 420 and, optionally, VCCMIN tracking cells 422. Particularly, because NMOS transistor 506 is always turned on, each normal tracking cell 420 discharges precharged dummy bit line DBL through NMOS transistors 510 and 506. On the other hand, because the gate and drain of NMOS transistor 522 are both coupled to dummy bit line DBL, if power supply voltage $V_{cc}$ has a high magnitude such that dummy word line DBL is precharged to a voltage level exceeding a threshold voltage of NMOS transistor 522, NMOS transistor 522 operates in a saturation region to conduct current, and VCCMIN tracking cell 422 also discharges precharged dummy bit line DBL through NMOS transistors 522 and 518. If, however, power supply voltage $V_{cc}$ has a low magnitude such that dummy word line is precharged to a voltage level below the threshold voltage of NMOS transistor 522, NMOS transistor 522 operates in a sub-threshold region and a current therethrough is low and substantially lower than a current through NMOS transistor 510. Consequently, dummy bit line DBL is mostly discharged through normal tracking cells 420.

In other words, when power supply voltage $V_{cc}$ has a high magnitude, both normal tracking cells 420 and VCCMIN tracking cells 422 operate to discharge dummy word line DBL. Dummy word line DBL is discharged at a high speed, and an unnecessarily high read margin is avoided. When power supply voltage $V_{cc}$ has a low magnitude, dummy bit line DBL is discharged mostly through normal tracking cells 420 and is therefore discharged at lower speed. Accordingly, an unacceptably low read margin is avoided.

Simulations have been performed of tracking circuit 416 as compared to conventional tracking circuits such as tracking circuit 302 shown in FIGS. 3A and 3B. Assuming that tracking circuit 302 of FIG. 3A includes 5 tracking cells 304, memory device 100 has a read margin of lower than 100 mV when $V_{cc}$ is 0.8 V or lower, and a read margin of approximately 150 mV or above when $V_{cc}$ is 1.5 V. In contrast, if tracking circuit 416 includes 3 normal tracking cells 420 and 6 VCCMIN tracking cells 422, memory device 400 consistent with the first embodiment of the present invention has a read margin of approximately 110 mV when $V_{cc}$ is about 0.75 V, and a read margin of approximately 140 mV when $V_{cc}$ is 1.5 V. Thus, tracking circuits consistent with the first embodiment of the present invention provide better read margins of memory devices than conventional tracking circuits.

Figure 6:
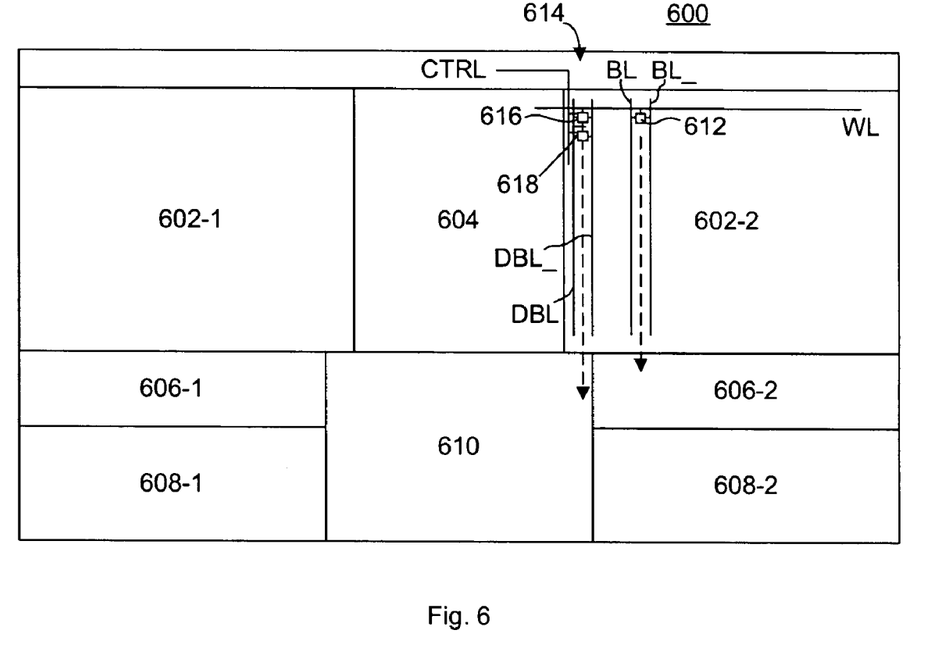
FIG. 6 shows a memory device consistent with a second embodiment of the present invention.

Consistent with a second embodiment of the present invention, a memory device including a tracking circuit and a control circuit for generating a clock signal for an I/O circuit has a further improved read margin through an arrangement such that the control circuit and the tracking circuit are on opposite sides of a memory array along a bit line direction. FIG. 6 shows a memory device 600 consistent with the second embodiment of the present invention.

As shown in FIG. 6, memory device 600 includes a plurality of memory arrays 602, e.g., arrays 602-1 and 602-2, a plurality of main decoders 604 (only one of which is shown), a plurality of multiplexers 606, e.g., multiplexers 606-1 and 606-2, a plurality of I/O circuits 608, e.g., I/O circuits 608-1 and 608-2, and a plurality of control circuits 610 (only one of which is shown). Each memory array 602 includes a plurality of memory cells (only one memory cell 612 is shown) arranged in a plurality of rows and a plurality of columns, each row corresponding to one of a plurality of word lines (only one word line WL corresponding to memory cell 612 is shown) and each column corresponding to one of a plurality of pairs of bit lines (only one pair of bit lines BL and BL_ corresponding to memory cell 612 is shown). Each main decoder 604 may include a word line decoder and is provided between two adjacent memory arrays 602. Each main decoder 604 operates on a clock signal to decode word line address signals and to provide word line signals to the adjacent memory arrays 602. Each memory array 602 corresponds to one of multiplexers 606 and one of I/O circuits 608. Each multiplexer 606 includes a bit line decoder and operates on a clock signal to decode bit line signals and to provide bit line address signals to the bit lines of its corresponding memory array 602. Each I/O circuit 608 accesses its corresponding memory array 602 and exchanges data with external circuits (not shown). I/O circuits 608 include sense amplifiers (not shown) for reading data from corresponding memory arrays 602. Control circuits 610 control adjacent main decoders 604, multiplexers 606, and I/O circuits 608.

Memory device 600 includes a plurality of tracking circuits 614 each corresponding to one memory array 602, only one tracking circuit 614 corresponding to memory array 602-2 being shown. Each tracking circuit 614 includes normal tracking cells 616 (only one of which is shown) and VCCMIN tracking cells 618 (only one of which is shown). Normal tracking cells 616 have structures similar to normal tracking cells 420 shown in FIG. 5, and VCCMIN tracking cells 618 have structures similar to VCCMIN tracking cells 422 shown in FIG. 5. Tracking circuit 614 receives a control signal CTRL and delays control signal CTRL through normal tracking cells 616 and VCCMIN tracking cells 618. Control signal CTRL is substantially synchronized with the clock signals for main decoders 604 and multiplexers 606. Control circuit 610 corresponding to memory array 602-2 is coupled to tracking circuit 614 for receiving the delayed control signal CTRL and for generating a clock signal for I/O circuit 608-2. I/O circuit 608-2 is triggered by the clock signal generated by the corresponding control circuit 610 to access memory array 602-2.

Consistent with the second embodiment of the present invention and as shown in FIG. 6, tracking circuit 614 and corresponding control circuit 610 are on opposite sides of memory array 602-2 along the direction of bit lines BL and BL_. Because tracking circuit 614 delays control signal CTRL not only through normal tracking cells 616 and VCCMIN tracking cells 618, but also through dummy bit line DBL, the configuration shown in FIG. 6 allows for an additional delay that emulates the delay through bit lines BL and BL_. Accordingly, a satisfactory read margin is guaranteed even for reading memory cells that are on opposite side of memory array 602 from corresponding I/O circuit 608, such as memory cell 612 shown in FIG. 6.

It is to be understood that a source and a drain of an MOS transistor are generally symmetrical to each other and therefore the source and drain of the transistors in the above circuit configurations are interchangeable.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
   a memory array;
   an I/O circuit for accessing the memory array;
   a tracking circuit including
      a dummy bit line,
      a first tracking cell including a first NMOS transistor, the first tracking cell being coupled to receive a control signal and also coupled to the dummy bit line through the first NMOS transistor, and
      a second tracking cell including a second NMOS transistor, the second tracking cell being coupled to receive the control signal and also coupled to the dummy bit line through the second NMOS transistor, a gate of the second NMOS transistor being coupled to the dummy bit line; and
   a control circuit coupled to the dummy bit line for generating a clock signal for the I/O circuit.

2. The memory device of claim 1, wherein the memory array includes a plurality of memory cells each having a 6-transistor structure.

3. The memory device of claim 1, wherein the I/O circuit includes one or more sense amplifiers.

4. The memory device of claim 1, further comprising a word line decoder coupled to receive the control signal as a clock signal for decoding word line address signals.

5. The memory device of claim 1, wherein the control circuit includes one or more inverters coupled between the dummy bit line and the I/O circuit.

6. The memory device of claim 1, wherein the memory array includes a plurality of memory cells arranged in a plurality of rows each corresponding to one of a plurality of word lines and a plurality of columns each corresponding to one of a plurality of pairs of bit lines, and wherein the I/O circuit and the tracking circuit are on opposite sides of the memory array along a direction of the bit lines.

7. The memory device of claim 1, wherein the first NMOS transistor has a gate coupled to receive the control signal and a drain coupled to the dummy bit line.

8. The memory device of claim 1, wherein the second NMOS transistor has a drain coupled to the dummy bit line.

9. The memory device of claim 1, wherein the first tracking cell includes a first PMOS transistor, a second PMOS transistor, a third NMOS transistor, a fourth NMOS transistor, and a fifth NMOS transistor, each of the first PMOS transistor, the second PMOS transistor, the first NMOS transistor, the third NMOS transistor, the fourth NMOS transistor, and the fifth NMOS transistor having a gate, a source, a drain, and a substrate, wherein
   the gate of the first PMOS transistor, the gate of the third NMOS transistor, the drain of the second PMOS transistor, the drain of the fourth NMOS transistor, and the drain of the fifth NMOS transistor are all coupled to one another and further coupled to a power supply voltage,
   the gate of the second PMOS transistor, the gate of the fourth NMOS transistor, the drain of the first PMOS transistor, the drain of the third NMOS transistor, and the drain of the first NMOS transistor are all coupled to one another,
   the substrates and sources of the first and second PMOS transistors are all coupled to the power supply voltage,
   the substrates and the sources of the third and fourth NMOS transistors and the substrates of the first and fifth NMOS transistors are grounded,
   the drain of the first NMOS transistor is coupled to the dummy bit line and the drain of the fifth NMOS transistor is coupled to another dummy bit line, and
   the gate of the first NMOS transistor is coupled to receive the control signal and the gate of the fifth NMOS transistor is coupled to receive a word line signal.

10. The memory device of claim 1, wherein the second tracking cell further includes a first PMOS transistor, a second PMOS transistor, a third NMOS transistor, a fourth NMOS transistor, and a fifth NMOS transistor, each of the first PMOS transistor, the second PMOS transistor, the second NMOS transistor, the third NMOS transistor, the fourth NMOS transistor, and the fifth NMOS transistor having a gate, a source, a drain, and a substrate, wherein
   the gate of the first PMOS transistor and the gate of the third NMOS transistor are both coupled to receive the control signal,
   the gate of the second PMOS transistor, the gate of the fourth NMOS transistor, the drain of the first PMOS transistor, and the drain of the third NMOS transistor, and the source of the second NMOS transistor are all coupled to one another,
   the substrates and sources of the first and second PMOS transistors are all coupled to a power supply voltage,
   the substrates and sources of the third and fourth NMOS transistors and the substrates of the second and fifth NMOS transistors are all grounded,
   the drain of the second NMOS transistor is coupled to the dummy bit line, and
   the gate of the fifth NMOS transistor is coupled to receive a word line signal, the drain of the fifth NMOS transistor is coupled to another dummy bit line, and the source of the fifth NMOS transistor is floating.

11. The memory device of claim 1, the tracking circuit further comprising one or more third tracking cells each structured substantially the same as the first tracking cell.

12. The memory device of claim 1, the tracking circuit further comprising one or more third tracking cells each structured substantially the same as the second tracking cell.

13. A memory device, comprising:
  a plurality of memory arrays;
  a plurality of I/O circuits;
  a plurality of control circuits; and
  a plurality of tracking circuits each including
    a dummy bit line,
    a first tracking cell including a first NMOS transistor, the first tracking cell being coupled to receive a control signal and also coupled to the dummy bit line through the first NMOS transistor, and
    a second tracking cell including a second NMOS transistor, the second tracking cell being coupled to receive the control signal and also coupled to the dummy bit line through the second NMOS transistor, a gate of the second NMOS transistor being coupled to the dummy bit line,
  wherein each memory array corresponds to one of the plurality of I/O circuits, one of the plurality of tracking circuits, and one of the plurality of control circuits, and wherein, for each memory array, the corresponding control circuit is coupled to the dummy bit line of the corresponding tracking circuit for generating a clock signal for the corresponding I/O circuit.

14. The memory device of claim 13, wherein the memory arrays include a plurality of memory cells each having a 6-transistor structure.

15. The memory device of claim 13, wherein the I/O circuits include one or more sense amplifiers.

16. The memory device of claim 13, further comprising a plurality of word line decoders each operating on a clock signal for decoding word line address signals and a plurality of bit line decoders each operating on a clock signal for decoding bit line address signals, the clock signal for the word line decoders and the clock signal for the bit lien decoders being substantially synchronized to the control signal.

17. The memory device of claim 13, wherein the control circuits include one or more inverters coupled between the dummy bit line of the corresponding tracking circuit and the corresponding I/O circuit.

18. The memory device of claim 13, wherein at least one of the memory arrays includes a plurality of memory cells arranged in a plurality of rows each corresponding to one of a plurality of word lines and a plurality of columns each corresponding to one of a plurality of pairs of bit lines, and wherein the I/O circuit and the tracking circuit corresponding to the at least one of the memory arrays are on opposite sides of the at least one of the memory arrays along a direction of the bit lines.

19. The memory device of claim 13, wherein the first NMOS transistor has a gate coupled to receive the control signal and a drain coupled to the dummy bit line.

20. The memory device of claim 13, wherein the second NMOS transistor has a drain coupled to the dummy bit line.

21. The memory device of claim 13, each tracking circuit further comprising one or more third tracking cells each structured substantially the same as the first tracking cell.

22. The memory device of claim 13, each tracking circuit further comprising one or more third tracking cells each structured substantially the same as the second tracking cell.

23. A tracking circuit in a memory device, wherein the memory device includes a memory array, an I/O circuit for accessing the memory array, and a control circuit, wherein the tracking circuit is coupled to receive and delay a control signal for the control circuit to generate a clock signal for the I/O circuit, the tracking circuit comprising:
  a dummy bit line;
  one or more first tracking cells each including a first NMOS transistor, each of the first tracking cells being coupled to receive a control signal and also coupled to the dummy bit line through the first NMOS transistor; and
  one or more second tracking cells each including a second NMOS transistor, each of the second tracking cells being coupled to receive the control signal and also coupled to the dummy bit line through the second NMOS transistor, a gate of the second NMOS transistor being coupled to the dummy bit line.

24. The tracking circuit of claim 23, wherein the memory array includes a plurality of memory cells arranged in a plurality of rows each corresponding to one of a plurality of word lines and a plurality of columns each corresponding to one of a plurality of pairs of bit lines, wherein the tracking circuit is on an opposite side of the memory array from the I/O circuit along a direction of the bit lines.

* * * * *

UNITED STATES PATENT AND TRADEMARK OFFICE
CERTIFICATE OF CORRECTION

PATENT NO. : 7,215,587 B2 Page 1 of 1
APPLICATION NO. : 11/172873
DATED : May 8, 2007
INVENTOR(S) : Cheng Hung Lee et al.

It is certified that error appears in the above-identified patent and that said Letters Patent is hereby corrected as shown below:

In claim 16, col. 11, line 34, "lien" should read --line--.

Signed and Sealed this

Seventeenth Day of July, 2007

JON W. DUDAS
*Director of the United States Patent and Trademark Office*